United States Patent
Watanabe et al.

(10) Patent No.: US 7,023,036 B2
(45) Date of Patent: Apr. 4, 2006

(54) FERROELECTRIC ELEMENT AND ACTUATOR USING THE SAME, AND INK JET HEAD AND INK JET RECORDING DEVICE

(75) Inventors: Osamu Watanabe, Tamana (JP); Takanori Nakano, Hirakata (JP); Kazunari Chikanawa, Kasuga (JP); Shogo Matsubara, Kasuga (JP); Shintaro Hara, Fukuoka (JP); Kazuo Nishimura, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 262 days.

(21) Appl. No.: 10/261,984

(22) Filed: Oct. 1, 2002

(65) Prior Publication Data

US 2003/0156163 A1 Aug. 21, 2003

(30) Foreign Application Priority Data

Oct. 2, 2001 (JP) ......................... 2001-306140
Oct. 26, 2001 (JP) ......................... 2001-328841

(51) Int. Cl.
*H01L 29/76* (2006.01)

(52) U.S. Cl. .......................... 257/295; 438/3
(58) Field of Classification Search .......... 257/295–310
See application file for complete search history.

(56) References Cited

U.S. PATENT DOCUMENTS

| 5,962,069 | A | * | 10/1999 | Schindler et al. | ............ 427/226 |
| 6,072,689 | A | * | 6/2000 | Kirlin | ........................... 361/311 |
| 6,613,586 | B1 | * | 9/2003 | Bailey | ............................ 438/3 |

FOREIGN PATENT DOCUMENTS

| JP | 2-49471 | 2/1990 |
| JP | 2-240976 | 9/1990 |
| JP | 4-92469 | 3/1992 |
| JP | 6-112545 | 4/1994 |
| JP | 10-217458 | 8/1998 |
| JP | 2000-4004 A | 1/2000 |

* cited by examiner

*Primary Examiner*—Fetsum Abraham
(74) *Attorney, Agent, or Firm*—Pearne & Gordon LLP (57) ABSTRACT

A ferroelectric element is described which has a structure including a common electrode 11, a ferroelectric film 10 formed on the common electrode 11, an individual electrode 3 formed on the ferroelectric film 10, a lead wire 15 for feeding electric power to the individual electrode 3, which is formed on the same plane as of the individual electrode 3, and a protection film 16 entirely covering the exposed parts of the ferroelectric film 10 and the individual electrode 3, and covering the lead wire 15. The protection film 16 is preferably made of a material whose Young's modulus is smaller than that of the ferroelectric film 10, exactly ½₀ or smaller of the Young's modulus of the ferroelectric film 10. Further, the ferroelectric film is formed with the insulation reinforcing film containing at least one of the elements constituting the ferroelectric film.

26 Claims, 8 Drawing Sheets

FERROELECTRIC ELEMENT AND ACTUATOR USING THE SAME, AND INK JET HEAD AND INK JET RECORDING DEVICE

BACKGROUND OF THE INVENTION

1. Field of the Invention

The present invention relates to a ferroelectric element and an actuator using the same, and an ink jet head and an ink jet recording device.

2. Discussion of the Related Art

An ink jet head of an ink jet recording device includes a pressure generating part having a pressure generating chamber containing ink liquid, and an actuator part for driving and causing the pressure generating chamber to eject ink drops. A ferroelectric element includes a ferroelectric film, and an individual electrode and a common electrode. Voltage is applied to between those electrodes and hence, to the ferroelectric film, so that the ferroelectric film shrinks and expands by its piezoelectric effect. The shrinking/expanding of the ferroelectric film vibrates a vibration plate, which is located adjacent to the ferroelectric element. The vibrating vibration plate drives the pressure generating chamber associated therewith to cause it to eject ink drops through a nozzle orifice of the pressure generating chamber.

In the ferroelectric element thus structured, the ferroelectric film including the upper electrode are barely formed, and the ferroelectric element is easily affected by ambient actors, e.g., humidity. If the ferroelectric element suffers from crystal structures defects, a called water path grows starting from such a defect. The breakdown voltage characteristic of the ferroelectric element is deteriorated, and in an extreme case, dielectric breakdown occurs in the ferroelectric element.

Further, in informing the ferroelectric film of the ferroelectric element, foreign materials possibly enters the ferroelectric film under forming. When the foreign materials enters the ferroelectric film, crystal structure defects and crystal grains abnormally grow in the film. As a result, defects, such as gaps and pin holes, are formed in the boundary between the ferroelectric film 10$a$ and abnormally grown grains. In a ferroelectric element formed using such a defects-contained ferroelectric film, dielectric breakdown sometimes occurs in the ferroelectric film under a voltage applied to between the individual electrode and the common electrode, the voltage being lower than a breakdown voltage proper to the film. If water enters the defects, the insulating property of the film is considerably deteriorated. Gaps on grain boundaries and pin holes are present between the upper and lower electrodes. When water enters there, oxide insulating materials are deoxidized by an electrochemical reaction, and metals separate out, and the ferroelectric film is dielectrically broken for a short time.

The techniques as given below are proposed to ameliorate the insulating property of the ferroelectric film, and to prevent the dielectric breakdown of the film.

In Japanese Patent Publication Hei-6-112545, the whole upper and lower surfaces of a functional layer constituted by alternately depositing piezoelectric ceramic layers and internal electrodes are coated with protective layers formed of a piezoelectric ceramic or insulator.

In Japanese Patent Publication Hei-2-240976, there is disclosed a technique to prevent the decrease in insulation resistance between inner electrodes in use for a long time under the environment of intrusion and permeation of moisture and high humidity by providing a petroleum wax layer which is formed at least on side surface of a laminated type piezoelectric actuator In the technique of Japanese Patent Laid-Open No. 6-112545, the side surfaces remains exposed. In the technique of Japanese Patent Publication Hei-2-240976, the upper surface remains exposed. Therefore, the piezoelectric actuator is affected by environmental conditions, through the side surfaces or the upper surface. The actuator still suffers from the problem stated above.

In the technique of Japanese Patent Publication Hei-6-112545, the piezoelectric actuator which outputs longitudinal displacement by utilizing the lateral strains in the actuator, is structured so that lateral strains, parallel to the electrodes, are not produced in a functional layer. Since it is formed with a bulk, piezoelectric ceramic layer, its displacement quantity is large. Therefore, the restriction on the displacement of the piezoelectric ceramic layer by the protection film is relatively small. However, in a case where the ferroelectric film as a functional layer is thin and hence, its displacement quantity is small, a protecting film which is formed on the ferroelectric film restricts the displacement of the ferroelectric film, and the ferroelectric element sometimes fails to exhibit the element characteristic as intended. The problem of restricting the displacement of the ferroelectric film by the protection film is also present in the technique of Japanese Patent Publication Hei-2-240976.

Further, Japanese Patent Publication Hei-2-49471 discloses a semiconductor element having a lamination structure having a lower electrode, a polysilicon oxide film, a ferroelectric film, and an upper electrode, which are laminated in this order with the lower electrode as the structure bottom Japanese Patent No. 3111416 (Japanese Patent Publication Hei-4-92469) discloses a technique to form an insulating film containing SiN as a main component between an active element, e.g., transistor, formed on the semiconductor substrate, and a capacitor formed of a ferroelectric material.

Japanese Patent No 3139491 (Japanese Patent Publication 2000-4004) discloses a ferroelectric element having a structure in which a ferroelectric material is sandwiched between two electrodes, and a normal dielectric layer formed with an SiO2 film, which is formed between a peripheral part of one of the electrodes and the ferroelectric film.

Japanese Patent Publication Hei-10-217458 discloses the following technique: In a piezoelectric element having a lower electrode, a piezoelectric film formed on the lower electrode, and an upper electrode formed on the piezoelectric film, a low-dielectric substance whose relative dielectric constant is lower than that of the piezoelectric film is formed at least in the grain-boundaries exposed region o the piezoelectric film.

In those conventional techniques, the breakdown voltage of the ferroelectric film is increased by laminating the polysilicon oxide film, SiN film or the like over the ferroelectric film. However, the adhesion property between any of those layers and the ferroelectric film is poor, and device reliability is not satisfactory.

The relative dielectric constant of the polysilicon oxide layer, the SiN film or the like is 10 or smaller, much smaller than 100 to 1000 of the relative dielectric constant of the ferroelectric film. For this reason, if the film thickness is increased to secure its satisfactory breakdown voltage, the voltage acting on the ferroelectric film becomes low. As a result, the drive voltage of the actuator must be increased.

Problems that arise when the ferroelectric film is used in combination with the polysilicon oxide film and the SiN film are due to the fact that the physical properties of those films, such as compositions, crystal structures, thermal expansion coefficients, are greatly different from those of the ferroelectric film. To cope with this, it is necessary to increase a thickness of the film in order to cover the gaps between the grains and pin holes are present between the upper and lower electrodes.

The publication of Japanese Patent Publication Hei-10-217458 describes that since the insulating property of the piezoelectric film is low in the crystal grain boundaries, the substance of low relative dielectric constant is formed in a region of the film where the crystal grain boundaries are exposed, whereby a voltage to be applied to the crystal grain boundaries is lowered to thereby improve the breakdown voltage characteristic of the piezoelectric film. The technique is applied to the piezoelectric film of the type in which adjacent crystal grains are continuously bonded and hence, there is no three dimensional spatial defects. Therefore, the technique is not effective for preventing the dielectric breakdown of the ferroelectric film suffering from such detects as gaps between the crystal grains and pin holes, to which the solution by the present invention is directed, viz., for the dielectric breakdown of the film, which is due to those defects.

The conventional technique advantageously improves the dielectric strength of the actuator, but involves the following problems: its poor adhesion property leads to the lowering of electrical and mechanical strength reliabilities, and the formation of the low relative dielectric constant layer needs a high drive voltage.

SUMMARY OF THE INVENITON

Accordingly, an object of the present invention is to provide technique on a ferroelectric element capable of perfectly eliminating adverse effects by environmental conditions.

Another object of the present invention is to provide technique on a ferroelectric element capable of alleviating the restriction on the ferroelectric film by the protection film.

Accordingly, an object of the present invention is to provide a ferroelectric element in which the insulating property of the ferroelectric film contained therein is improved, and its electrical and mechanical strength reliabilities are improved, and no increased of the drive voltage is required, and an actuator using the same, and an ink jet head and an ink jet recording device.

The present invention may be implemented in the form of a ferroelectric element comprising: a first electrode; a ferroelectric film formed on the first electrode; a lead wire, formed on the same plane as of the second electrode, for feeding electric power to the second electrode; and a protection film entirely covering the exposed parts of the ferroelectric film and the second electrode, and covering at least a part of the lead wire.

Therefore, the ferroelectric element is completely covered with the protection film. As a result, the ferroelectric element is completely shut off from environmental conditions.

The protection film is preferably made of a material whose Young's modulus is smaller than that of the ferroelectric film 10, exactly $\frac{1}{20}$ or smaller of the Young's modulus of the ferroelectric film.

If such a material is used, the protection film will displace following a displacement of the ferroelectric film. Accordingly, the restriction on the displacement of the ferroelectric film by the protection film is lessened.

Further, the present invention may be implemented in the form of a ferroelectric element comprising: a first electrode; a ferroelectric functional film formed on the first electrode; a second electrode formed on the ferroelectric functional film; and the ferroelectric functional film being formed with a ferroelectric film and an insulation reinforcing film containing at least one of the elements constituting the ferroelectric film.

The ferroelectric functional film, which is formed with a ferroelectric film and an insulation reinforcing film containing at least one of the elements constituting the ferroelectric film, is formed between the electrodes. The defects (boundaries between the ferroelectric film and abnormally grown grains, gaps between crystal grains, pin holes, etc.), which will cause the lowering of the insulating property of the ferroelectric film, is completely covered with the insulation reinforcing film to thereby improve the insulating properties of the ferroelectric film.

DETAILED DESCRIPTION OF THE INVENTION

First Embodiment

The first embodiment of the present invention will be described in detail with reference to FIGS. 1 to 3, and 9 to 12. Throughout the drawings, like reference numerals are used for designating like or equivalent portions, for simplicity.

Figure 9:
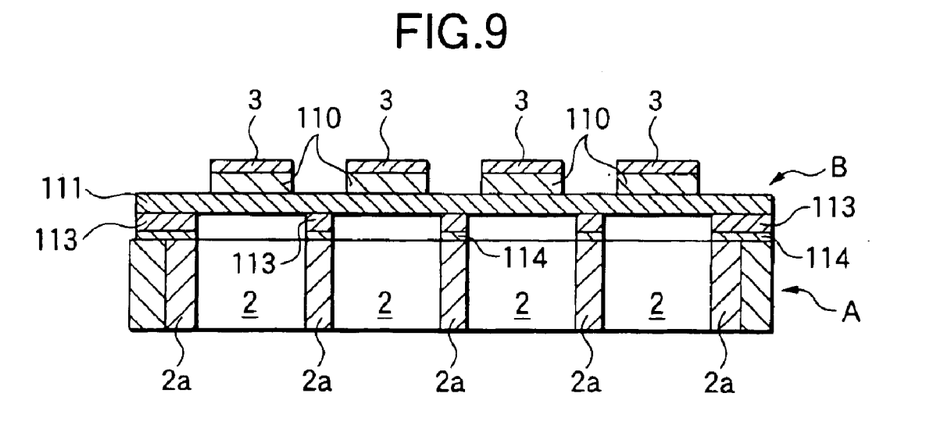
FIG. 9 is a cross sectional view showing a structure of an actuator portion of the ink jet recording head according to the second embodiment.
Figure 10:
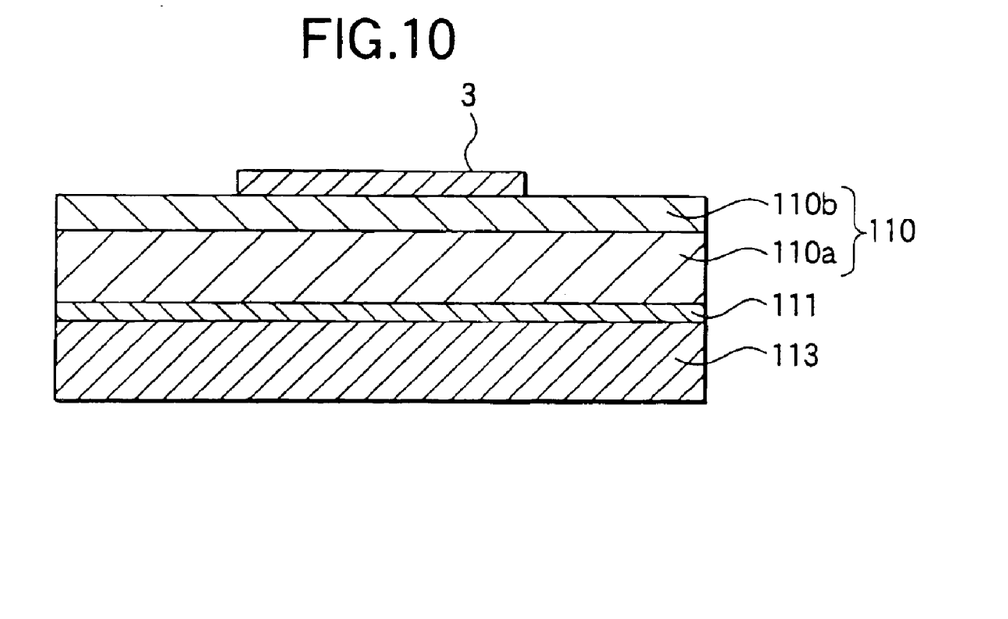
FIG. 10 is a cross sectional view showing a ferroelectric element which is the second embodiment of the invention.
Figure 11:
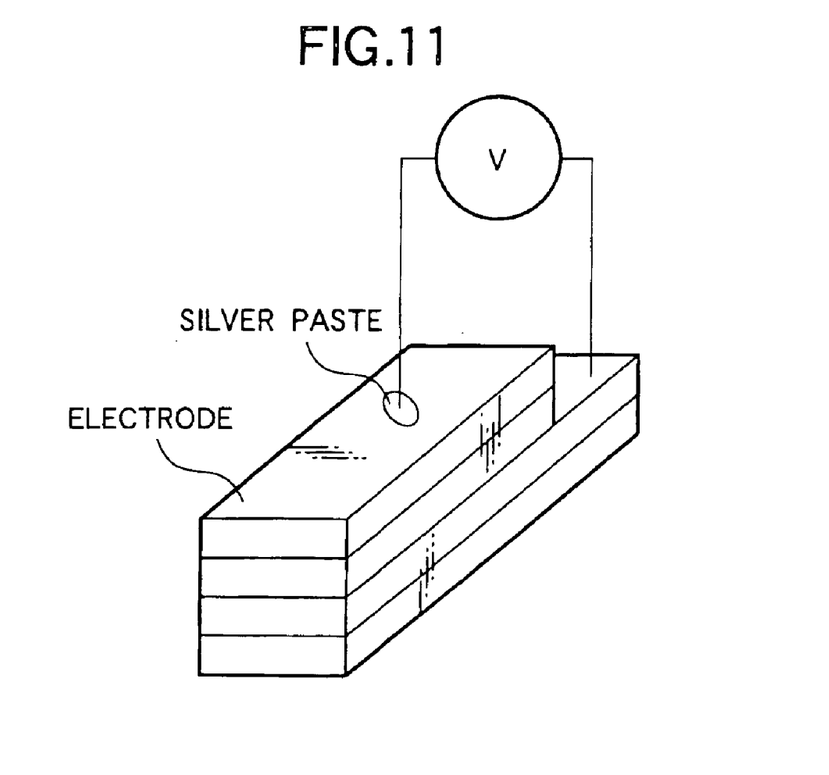
FIG. 11 is a perspective view showing an arrangement of a cantilever for measuring a piezoelectric displacement.
Figure 12A:
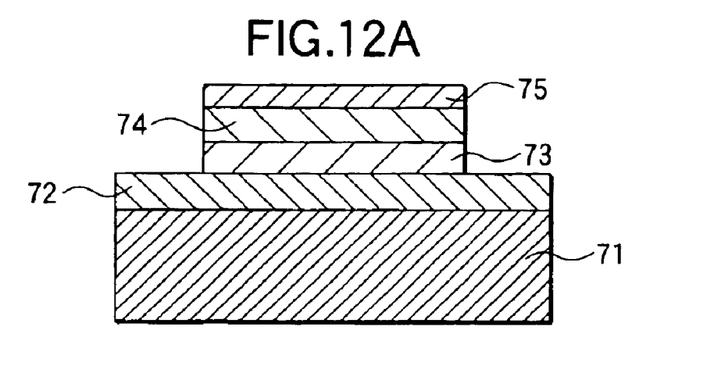
FIG. 12 is a cross sectional view showing a method of fabricating an actuator in an ink jet head.

FIG. 9 is a cross sectional view showing a structure of an actuator portion of the ink jet recording head according to second embodiment FIG. 10 is a cross sectional view showing a ferroelectric element which is a first embodiment of the invention. FIG. 11 is a perspective view showing an arrangement of a cantilever for measuring a piezoelectric displacement. FIG. 12A is a cross sectional view showing a method of fabricating an actuator in an ink jet head.

Figure 1:
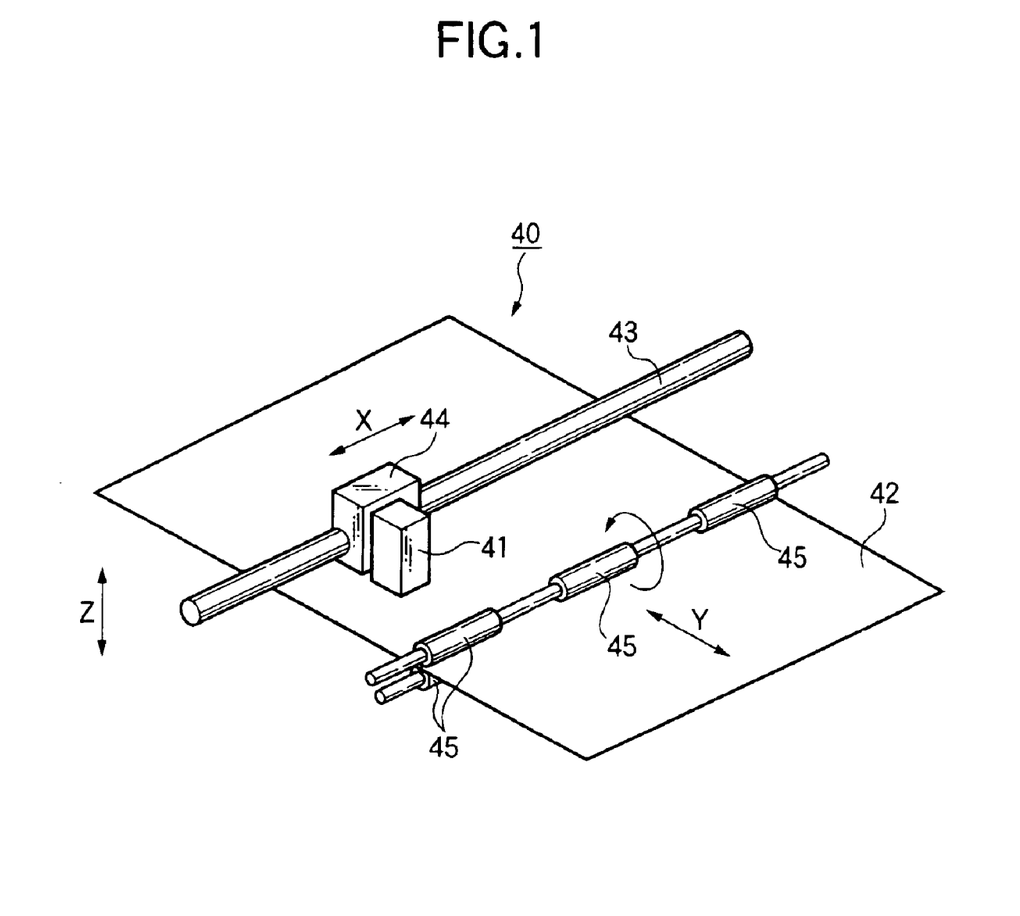
FIG. 1 is a perspective view showing an overall arrangement of an ink jet recording device using ferroelectric elements, each of which is an embodiment of the present invention.

Reference is made to FIG. 1, an ink jet recording device 40 is provided with an ink jet head 41, constructed according to the present invention, which records something on a recording medium by utilizing piezoelectric effect of a ferroelectric element. To record something on a recording medium 42, such as a recording sheet of paper. the ink jet head 41 ejects an ink drop, and the ink drop lands on the recording medium 42. The ink jet head 41 is mounted on a carriage 44, which is mounted on a carriage shaft 43 disposed in the main scan direction X. The ink jet head 41 is reciprocatively moved in the main scan direction X with the reciprocative movement of the carriage 44 along the carriage shaft 43. The ink jet recording head 40 includes movement means 45 which may consist of a plurality of rollers. The movement means 45 moves the recording medium 42 in the sub-scan direction Y substantially vertical to the width direction (i.e., main scan direction X) of the ink jet head 41.

Figure 2:
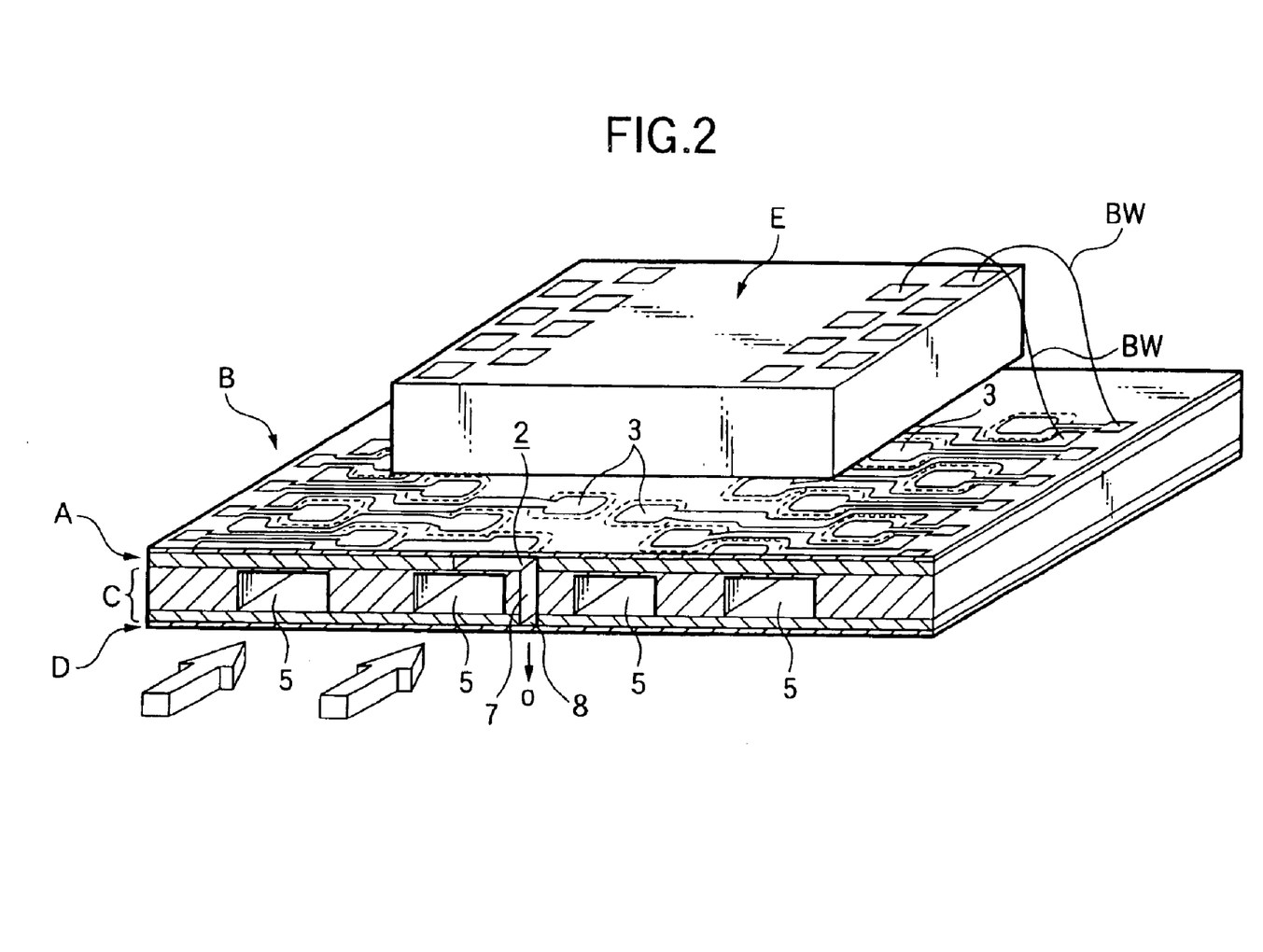
FIG. 2 is a cross sectional view showing an overall arrangement of an ink jet recording head of the FIG. 1 device.
Figure 3:
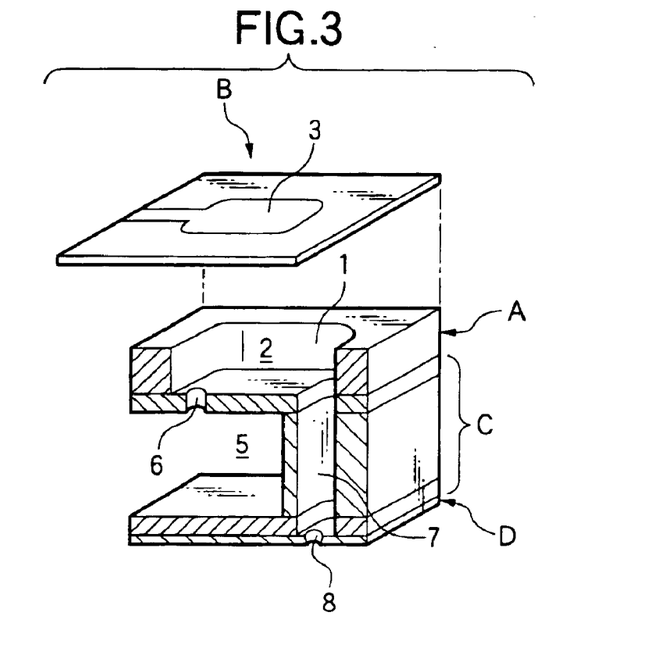
FIG. 3 is a perspective view showing a key portion of the ink jet recording head shown in FIG. 2.

FIG. 2 is a cross sectional view showing an overall arrangement of the inkjet recording head 41, which is constructed according to the invention FIG. 3 is a perspective view showing a key portion of the ink jet recording device shown in FIG. 2.

In FIGS. 2 and 3, reference character "A" designates a pressure generating part having an opening 1 formed therein; "B" designates an actuator part disposed covering the upper opened surface of the recess 1; and "C" designates an ink passage part disposed covering the lower opened surface of the opening 1. The opening 1 of the pressure generating part A is defined by the actuator part B and the ink liquid passage part C, which are located above and below the opening, thereby forming a pressure generating chamber 2. Individual electrodes or second electrodes 3 are provided on the actuator part B at positions above the pressure generating chamber 2. As seen from FIG. 2, a number of pressure generating chambers 2 and a number of individual electrodes 3 are disposed in zig-zag fashion. The ink liquid passage part C includes common liquid chambers 5 each used in common for the pressure generating chambers 2 arranged in the ink liquid supplying direction, ink supply ports 6 for communicatively connecting the common liquid chambers 5 to the pressure generating chambers 2, and ink passages 7 through which ink liquid flows out of the pressure generating chambers 2 Reference character D is a nozzle plate having nozzle orifices 8 formed therein, which are communicatively connected to ink passages 7. In FIG. 2, reference character E is an IC chip E which applies voltage to the number of individual electrodes 3 by way of bonding wires BW.

A structure of the actuator part B of the second embodiment will be described hereunder with reference to FIG. 9.

Across-section of the actuator part B illustrated is viewed in a direction perpendicular to the ink liquid supplying direction shown in FIG. 2. The pressure generating part A illustrated consists of four pressure generating chambers 2 arrayed in the direction perpendicular to the ink liquid supplying direction.

The actuator part B is formed with individual electrodes 3 located above the pressure generating chambers 2, ferroelectric functional films 110 located right under the individual electrodes 3, and a vibration plate 111 which are displaced to vibrate by ferroelectric effect of the ferroelectric functional film 110. The vibration plate 111 is made of a conductive material, and serves as a common electrode or first electrode common for all the pressure generating chambers 2. The actuator part B includes vertical walls 113 respectively located on partitioning walls 2a for partitioning the pressure generating chambers 2. In the figure, reference numeral 114 designates adhesive 114 for bonding the pressure generating part A to the actuator part B. The vertical walls 113 have each the following function When the pressure generating part A and the actuator part B are bonded by using the adhesive 114, part of the adhesive 114 highly possibly flows out of the partitioning walls 2a. In this case, the vertical walls 113 increases a distance between the upper surface of the pressure generating chambers 2 and the lower surface of the vibration plate 111 so that the adhesive 114 does not attach to the vibration plate 11 and the vibration plate 111 displaces and vibrates as intended. While in the embodiment, the vibration plate 111 serves also as the common electrode as mentioned above, the vibration plate and the common electrode may be formed separately, if required.

In the embodiment, the individual electrodes 3, ferroelectric functional films 110 and vibration plate 111 cooperate to form a ferroelectric element.

The individual electrodes 3 are each made of Pt (platinum), and the vibration plate 11 is made of any of Cr (chromium), Cu (copper), Mo (molybdenum) and Ta (tantalum). The individual electrodes 3 are films each of 0.1 to 1.0 μm thick; the ferroelectric functional films 110 are films each of 2 to 6 μm thick; and the vibration plate 111 is a film of 3 to 10 μm thick.

As shown in FIG. 10, the ferroelectric functional films 110 are each formed with a ferroelectric film 110a made of a perovskite oxide of, for example, lead titanate zirconate, and an insulation reinforcing film 110b containing at least one of the elements constituting the ferroelectric film 110a (in this case, at least one selected from among Pb, Zr and Ti).

The ferroelectric film 110a may be made of a perovskite oxide, corundum type oxide, bismuth layered oxide or mixture of them which is expressed by the following chemical formula where A contains at least one kind of element from among Pb, Ba, Nb, La, Li, Sr, Bi, Na, and K, and B contains at least one kind of element selected from among Ti, Ta, Mg, Mo, Ni and Nb Specific examples of the chemical formula are $((Pb_{1-x} 9La_x) TiO_3$, and $(Pb_{1-x} La_x) (Zr_{1-y}Ti_y)O_3$, $Pb(Ti_{1-x-y}Mg_xNb_y) O_3$, $(Ba_{1-x}Sn_y) (Zr_{1-y}Ti_y) O_3$, $LiNbO_3$, $KNbO_3$, $LiTaO_3$, $PbMoO_3$, $(Ca_{1-x}Cu_x) TiO_3$, $(Bi_{1-x}K_x) TiO_3$, $(Bi_{1-x}Na_x) TiO_3$, $SrBi_{12}Ta_2O_9$, $SrBi_{12}Ni_2O_9$, $BaBi_{12}Ta_2O_9$, $BaBi_{12}Ni_2O_9$, $B_{14}Ti_3O_{12}$, $SrB_{14}T_4O_{15}$, and $BaB_{14}T_4O_{15}$.

Accordingly, when $((Pb_{1-x} 9La_x) TiO_3$ is used for the ferroelectric film 110a, the insulation reinforcing film 110b contains at least one kind of elements Pb, La, Ti and Zr.

In FIG. 10, in the actuator part B, the vibration plate 111, ferroelectric film 110a, insulation reinforcing film 110b and individual electrodes 3 are successively formed on a substrate corresponding to the vertical wall 113. The insulation reinforcing film 110b is located between the ferroelectric film 110a and the individual electrode 3. In an example where the individual electrode, ferroelectric film, insulation reinforcing film, and vibration plate are successively formed on an MgO substrate, then the resultant structure is bonded onto a substrate corresponding to the vertical wall, and finally the MgO substrate is removed, the insulation reinforcing film is located between the ferroelectric film and the vertical wall. Accordingly, the insulation reinforcing film 110b may be located closer to the vibration plate 111, and the ferroelectric film 110a may be closer to the individual electrode 3, while in FIG. 5, the ferroelectric film 110a is located closer to the vibration plate 111, and the insulation reinforcing film 110b is located closer to the individual electrode 3. Additionally, the insulation reinforcing films 110b may be formed on both sides of the ferroelectric film 110a, while one insulation reinforcing film 10b is used. An alternative structure may be employed which consists of the ferroelectric films 110a and the insulation reinforcing films 110b, which are alternately laminated.

If a PLT film is formed in advance, and a ferroelectric film 110a, e.g., PZT film, is formed on the former, crystallinity of the ferroelectric film 110a is improved.

When the ferroelectric film 110a is a single crystal film epitaxially grown in the polarization axis direction or an orientation film, a drive voltage for driving the ferroelectric thin film element is advantageously reduced. Further, with the feature that the insulation reinforcing film consists of a single crystal film or an orientation film, low power dissipation and high speed driving of the ferroelectric element are secured.

The insulation reinforcing film 110b is a low crystalline film, such as a polycrystalline film of a pyrochlore-type oxide film, a polycrystalline film of a perovskite-type oxide film, or an amorphous film which is non-crystalline. If necessary, the insulation reinforcing film 110b may be made of pyrochlore-type oxide and parovskite-type oxide.

Such a low crystalline film may be formed under any of the following conditions or a combination of them.

A first condition is to lower a film forming temperature to below that (500 to 600° C.) in the process of forming the ferroelectric film. Under the first condition, the pyrochlore film is formed at 350 to 450° C., and a pyrochlore-perovskite mixture film is formed at 450 to 500° C., for example. The first condition is advantageous in that it is easy to form a desired thin film since there is no need of an additional sputtering equipment, and the film forming condition is merely changed.

A second condition is to increase a pressure in the sputtering process to above a pressure (0.1 to 0.3 Pa) in the process of forming the ferroelectric film For example, it is increased to 2 to 3 Pa.

A third condition is to increase an oxygen partial pressure ($O_2$/Ar flow rate ratio) to above that (2 to 10%) in the process of forming the ferroelectric film, viz., it is increased to for example, 30 to 50%.

A relative dielectric constant of the insulation reinforcing film 10b is lower than that of the ferroelectric film 110a. If so selected, a ratio of the voltage applied to the ferroelectric film 10a increases, and hence, the drive voltage for the ferroelectric element lowers, resulting in improvement of the electrical and mechanical reliabilities.

It is evident that the film forming process is not limited to the sputtering process. A MO-CVD process using an organic metal organic metal, sol-gel process or another film forming process may be used instead.

Thus, in the ferroelectric element of the instant embodiment, the ferroelectric functional film 110, which includes the ferroelectric film 110a and the insulation reinforcing film 110b of which the crystal structure is different from that of the ferroelectric film 110a, is formed between the electrode 3 and the vibration plate (common electrode) 111. The defects (boundaries between the ferroelectric film and abnormally grown grains, gaps between crystal grains, pinholes, etc.), which will cause the lowering of the insulating property of the ferroelectric film 110a, is completely covered with the insulation reinforcing film 110b to thereby improve the insulating properties of the ferroelectric film 110a.

Increase of the drive voltage is successfully prevented when the insulation reinforcing film 110b is made of a high-dielectric material, such as perovskite oxide having an ferroelectricity, corundum type oxide, and bismuth layered oxide.

Where a crystal structure of the insulation reinforcing film 110b is different from that of the ferroelectric film 110a, a level of covering the defects, such as gaps between crystal grains and pin holes in the ferroelectric film 110a, with the insulation reinforcing film 110b is greatly increased The reason for this may be estimated as follows. In the growing of thin films which are equal in crystal structure and composition, the films grow while reflecting the crystallinity and defects in the substrate. In the growing of thin films which are different in crystal structure, crystallinity and composition, another new nucleus must be generated. For this reason, it is easy to cover the defects and pin holes.

The feature that the insulation reinforcing film 110b contains at least one of the elements constituting the ferroelectric film 110a brings about a further advantage; The adhesion property of the insulation reinforcing film with the ferroelectric film 110a is enhanced, resulting in a reliability of the ferroelectric film 110a.

The feature that the insulation reinforcing film 10b contains at least one of the elements constituting the ferroelectric film 110a brings about an additional advantage; A relative dielectric constant of the insulation reinforcing film 110b approximates to that of the ferroelectric film 110a, and this leads to decrease of the drive voltage.

If in the film forming process, an amount of Pb contained in the insulation reinforcing film 110b is selected to be larger than that of Pb in the ferroelectric film 110a, a Pb concentration in the surface region of the ferroelectric film 110a is increased And, a crystallinity in the ferroelectric film lowers to thereby stop the abnormal growing of crystal grains in the ferroelectric film 110a. Further, the Pb contained at high density in the surface region of the ferroelectric film 110a covers the defects. Accordingly, the insulating property of the insulation reinforcing film 110b is further enhanced.

If an amount of oxygen contained in the insulation reinforcing film 110b is selected to be larger than that of oxygen in the ferroelectric film 110a, the insulating property of the insulation reinforcing film 110b is enhanced.

If the crystallinity in the insulation reinforcing film 110b is lower than that in the ferroelectric film 110a, the insulating property of the insulation reinforcing film 110b is enhanced.

The crystallinity of the film is measured by using an X-ray diffraction method or an electron beam diffraction method. When the ferroelectric film is an epitaxial monocrystalline film, the electron beam diffraction pattern is a spot pattern, and when the low crystalline film is a polycrystalline film, it is a ring pattern. When the insulation reinforcing film is an amorphous film, the ring shape of the electron beam diffraction pattern is not clear, by a halo pattern. When the X-ray diffraction method is used for the crystallinity measurement, the crystallinity is judged based on the half value width of a specific X-ray diffraction peak obtained from the ferroelectric film. A case where the perovskite PZT is used for the ferroelectric film 10a will be described. For example, the half value width of the (001) diffraction peak of the x-ray diffracted by the PZT film represents a crystallinity of the PZT film. When a low crystalline film as the insulation reinforcing film is formed on the PZT film, a diffracted X-ray from the PZT film is scattered by the low crystalline film to increase the PZT (001) diffraction peak. If an increasing rate of the half value width when the half value width of the (001) diffraction peak increases from "a0" to "a", is defined as P=(a−a0)/a0, then $1<p\leq2.5$ is preferable for the changing rate of the half value width. $1.2<p\leq2.5$ is more preferable, and $1.5<p\leq2.5$ is further more preferable. p>2.5 is not preferable since when p>2.5, the characteristic of the ferroelectric film is considerably deteriorated, and the drive voltage increases. To confine the increase of the drive voltage within 30%, $1<p\leq2.5$ must be satisfied. To increase the dielectric strength by 20% or higher, $1.2<p\leq2.5$ must be satisfied. To increase the same by 50% or higher, $1.5<p\leq2.5$ must be satisfied.

In an example, in the structure of FIG. 10, an MgO substrate was used for the vertical wall 113. the vibration plate 11 of Pt, ferroelectric film 110a of PZT {Pb(Zr$_{0.53}$Ti$_{0.27}$)O$_3$} and individual electrodes 3 of Pt, and insulation reinforcing film 110b were formed on the MgO substrate. Various types of films were used for the insulation reinforcing film 110b, and voltage characteristics and insulation characteristic of those films were evaluated.

A Pt film of 0.2 μm thick and PZT film of 2.7 μm were successively formed on a single crystal (monocrystalline) MgO substrate having a (100) crystal orientation. An RF magnettron sputtering equipment was used for the film forming equipment. A Pt film was formed under conditions of Ar gas, 0.3 Pa and substrate temperature of 650° C. A PZT film was formed under conditions of an Ar mixture gas at 10% of oxygen partial pressure, 0.3 Pa and substrate temperature of 620° C. Crystal structures of the Pt and PZT films thus formed were analyzed by using a power X-ray diffraction equipment. The Pt film and the PZT film were both epitaxial films oriented along the (001) crystal orientation of the single crystal MgO substrate.

Next, an insulation reinforcing film of 0.3 μm thick was formed by using the same PZT target and an RF magnettron sputtering equipment.

A sample A of the insulation reinforcing film was formed at 400° C. of the substrate temperature Other sputtering conditions were the same as those of forming the PZT film.

A sample B was formed at a sputtering pressure of 2 Pa. Other sputtering conditions were the same as those of forming the PZT film.

A sample C was formed at 50% of the oxygen partial pressure. Other sputtering conditions were the same as those of forming the PZT film.

A sample D was a comparison, and for the sample D, an SiO$_2$ film was formed by sputtering process.

A sample E was also a comparison, and for the sample E, a PZT film of 3 μm was formed, and an insulation reinforcing film was not formed.

Crystal structures of the films of the samples A, B and C were analyzed by using a power X-ray diffraction equipment The analysis showed that the crystal structure of the insulation reinforcing film is amorphous, perovskite polycrystalline, pyrochlore polycrystalline or a mixture of crystal phases of them. The compositions of the ferroelectric film and the insulation reinforcing film were measured by the EPMA analysis, and the results of the measurement were tabulated in Table 1. Pb content (Pb/(Zr+Ti) atom ratio) or O content (O/(Zr+Ti) atom ratio) of the insulation reinforcing film is larger than that of the ferroelectric film.

TABLE 1

|  | (Pb/(Zr + Ti) atom ratio) | (O/(Zr + Ti) atom ratio) |
| --- | --- | --- |
| ferroelectric film | 1.0–1.2 | 2.6–2.8 |
| sample A (insulation reinforcing film) | 1.3–1.4 | 2.7–2.9 |
| sample B (insulation reinforcing film) | 1.2–1.3 | 2.8–3.0 |
| sample C (insulation reinforcing film) | 1.2–1.3 | 2.9–3.0 |

A Pt film is formed on each of the samples by sputtering at room temperature. Breakdown voltage of each sample and relative values of voltage (drive voltage) applied to the upper and lower electrodes in order to produce equal piezoelectric displacement, are tabulated in Table 2. The breakdown voltage is defined as a voltage at which a leak current density of the element is 1 μA/cm$^2$ or higher. For measuring the piezoelectric displacements of the samples, a plate-like cantilever of 15 mm in length and 2 mm in width was manufactured, and one end of the cantilever was fixed and a displacement of the other end thereof was measured by use of a laser Doppler displacement gauge as shown in FIG. 11.

TABLE 2

|  | breakdown voltage (V) | drive voltage (relative value) |
| --- | --- | --- |
| sample A | 160–190 | 1.03–1.06 |
| sample B | 150–170 | 1.03–1.08 |
| sample C | 120–160 | 1.08–1.12 |
| comparison D | 150–200 | 5–15 |
| comparison E | 50–110 | 1.00 |

As seen from Table 2, a breakdown voltage of the ferroelectric functional film of the invention is two to three times as high as that of the comparison E not having the insulation reinforcing film The drive voltage of the ferroelectric functional film of the invention is about ⅕ as high as that of the comparison D of the conventional art, which uses SiO$_2$ for the insulation reinforcing film.

A relative dielectric constant of the ferroelectric film manufactured in each example was about 300. A relative dielectric constant of the ferroelectric film depends largely on the crystal structure of the film. A relative dielectric constant of the amorphous film was 90 to 150; that of the perovskite oxide film was 250 to 900; and a mixture film of pyrochlore and perovskite was 200 to 450.

A relative dielectric constant of the insulation reinforcing film of the invention is sufficiently larger than that (about 4 to 10) of the conventional polysilicon oxide film or SiN. Sometimes, it is larger than that of the ferroelectric film. For this reason, when comparing with the comparison D fabricated by the conventional technique, the drive voltage to obtain equal piezoelectric displacement was considerably reduced.

As described above, according to the invention, the ferroelectric element has a high insulating property, and the drive voltage is reduced.

In the embodiment mentioned above, the ferroelectric film is expitaxially grown on the single crystal MgO substrate having the (100) crystal orientation, as described above. If required, a Pt polycrystalline film and a ferroelectric polycrystalline film may be formed on an Si substrate or a silica substrate.

Figure 12B:
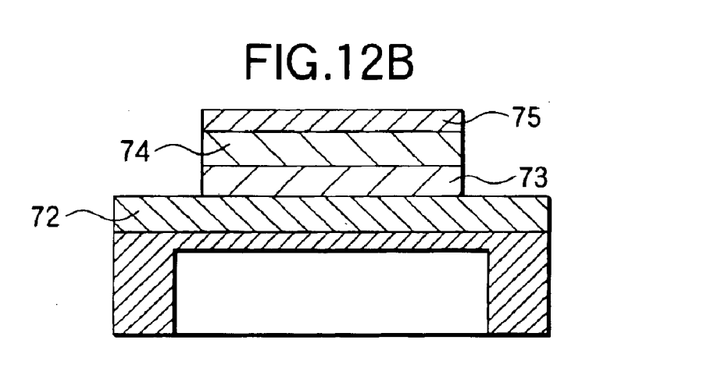
Figure 12C:
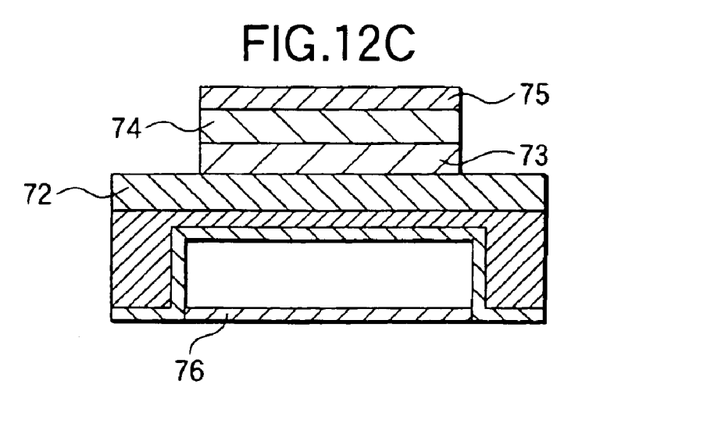

A method of fabricating the actuator of an ink jet head will be described with reference to FIGS. 12A to 12C FIG. 12A shows a structure of the sample A. In the figure, reference numeral 71 is a single crystal MgO substrate; 72 is a Pt film serving as both a vibration plate and a common electrode; 73 is a PZT epitaxial film as a ferroelectric film; 74 is a low crystalline film as an insulation reinforcing film; and 75 is a Pt film as an individual electrode. A desired part of the single crystal MgO substrate are etched away to form a structure shown in FIG. 12B. An aqueous solution of a phosphoric acid heated to 80° C. was used for the etching of the single crystal MgO substrate. Apart of the single crystal MgO substrate, which should be left, is coated with resist to block the etching by the phosphoric acid. The Pt film is not dissolved by the phosphoric acid. Accordingly, the etching, which has reached the Pt film, does not progress beyond the Pt film. If necessary, a part of the single crystal Mgo substrate is left while not etched away, and is used as the vibration plate. In the structure, a surface of the single crystal MgO substrate is coated with resist or polyimide to form an ink shut-off layer 76. In this way, an actuator corresponding to the actuator part B shown in FIG. 10 may be fabricated, and the ink jet head shown in FIG. 9 may be fabricated.

In the embodiment thus described, the ferroelectric element of the invention is applied to the actuator used for ejecting ink in the ink jet recording device. It is evident, however, that the invention is applied to other various devices, such as a temperature sensor utilizing the pyroelectric property of the ferroelectric material, an optical modulation device utilizing electrooptical effect, an optical actuator based on the photoelastic effect, and a SAW device.

In the embodiment, the individual electrodes 3 are used as second electrodes and the common electrode 11 is used as a second electrode. If required, the individual electrodes 3 may be used as the first electrode and the common electrode (vibration plate 11) may be used as the second electrode.

If the actuator using the ferroelectric elements as described above is used, a stable displacement of the vibration plate is ensured. Accordingly, the ink jet head using such an actuator can stably eject ink drops. And, the ink jet recording device with such an ink jet head can print high quality pictures since the ink ejection is stable.

As seen from the foregoing description, the ferroelectric functional films each of which is formed with a ferroelectric film and an insulation reinforcing film containing at least one of the elements constituting the ferroelectric film, are formed between the electrodes. Therefore, defects which will deteriorate the insulation of the ferroelectric film is completely covered with the insulation reinforcing film, thereby improving the insulation of the insulation reinforcing film. The adhesion property between the ferroelectric film and the insulation reinforcing film is good, a relative dielectric constant of the insulation reinforcing film approximates to that of the ferroelectric film, and hence, the drive voltage is reduced.

If an amount of Pb contained in the insulation reinforcing film is selected to be larger than that of Pb in the ferroelectric film, a Pb concentration in the surface region of the ferroelectric film is increased. And, a crystallinity in the ferroelectric film lowers, and hence, the insulating property of the insulation reinforcing film is further enhanced.

If an amount of oxygen contained in the insulation reinforcing film is selected to be larger than that of oxygen in the ferroelectric film, the insulating property of the insulation reinforcing film is enhanced.

If the crystallinity of the insulation reinforcing film is set to be lower than that of the ferroelectric film, the insulating property of the insulation reinforcing film is enhanced.

If the actuator using such ferroelectric elements is used, a stable displacement of the vibration plate is ensured.

Accordingly, the ink jet head using such an actuator can stably eject ink drops.

And, the ink jet recording device with such an ink jet head can print high quality pictures since the ink ejection is stable.

Second Embodiment

The second embodiment of the present invention will be described in detail with reference to FIGS. 1 through 8. Throughout the drawings, like reference numerals are used for designating like or equivalent portions, for simplicity.

Figure 4:
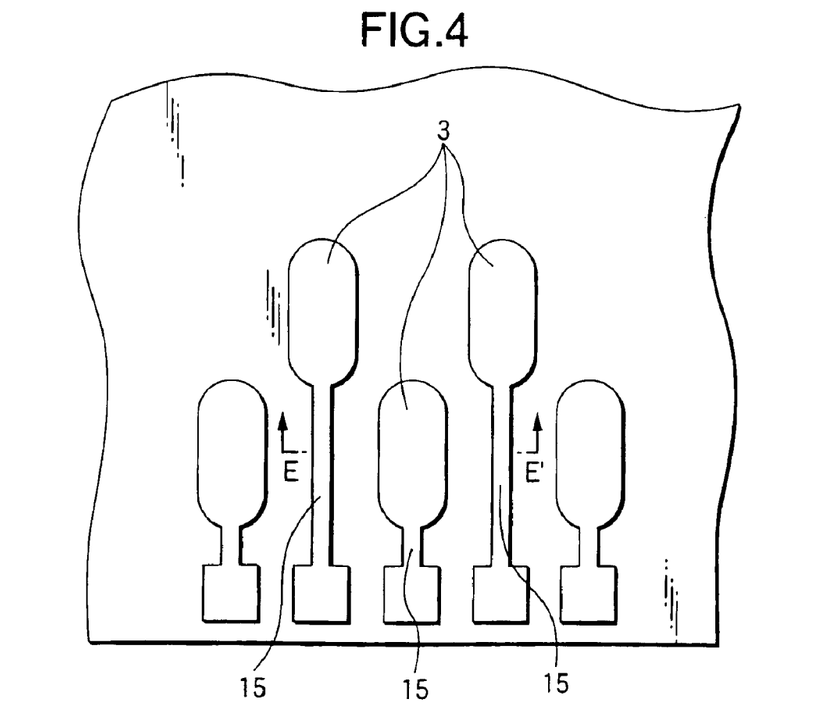
FIG. 4 is a plan view showing a key portion of an actuator part of the ink jet head in FIG. 2.
Figure 5:
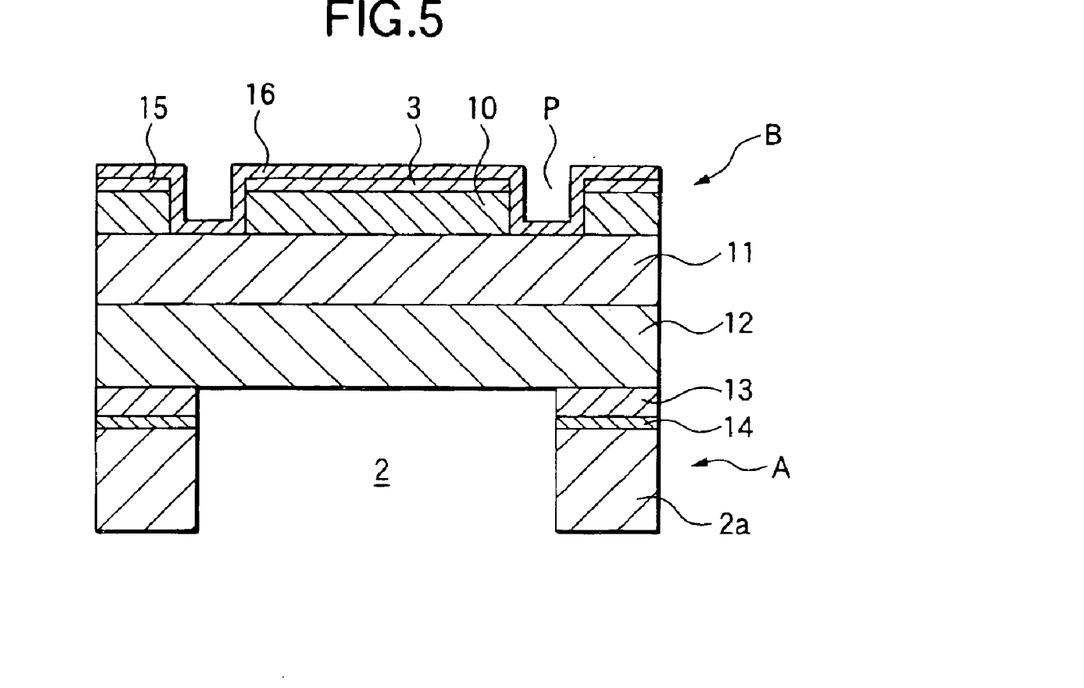
FIG. 5 is a cross sectional view showing a structure of the actuator part ink jet head in FIG. 2.
Figure 6:
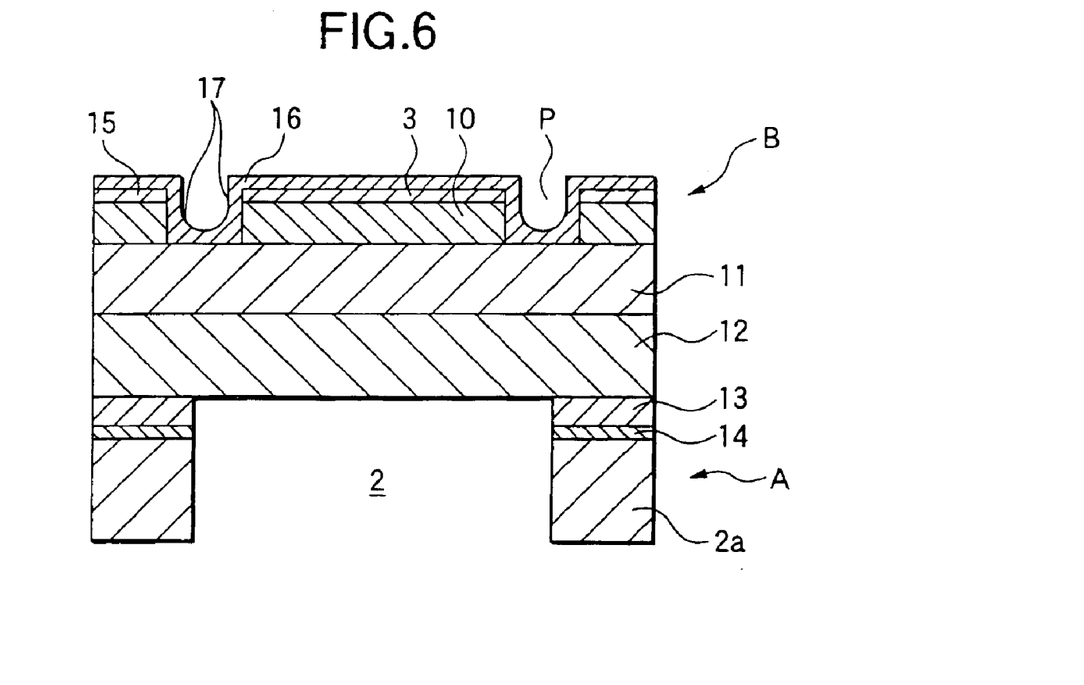
FIG. 6 is a cross sectional view showing another structure of the actuator part of the ink jet head in FIG. 2.
Figure 7:
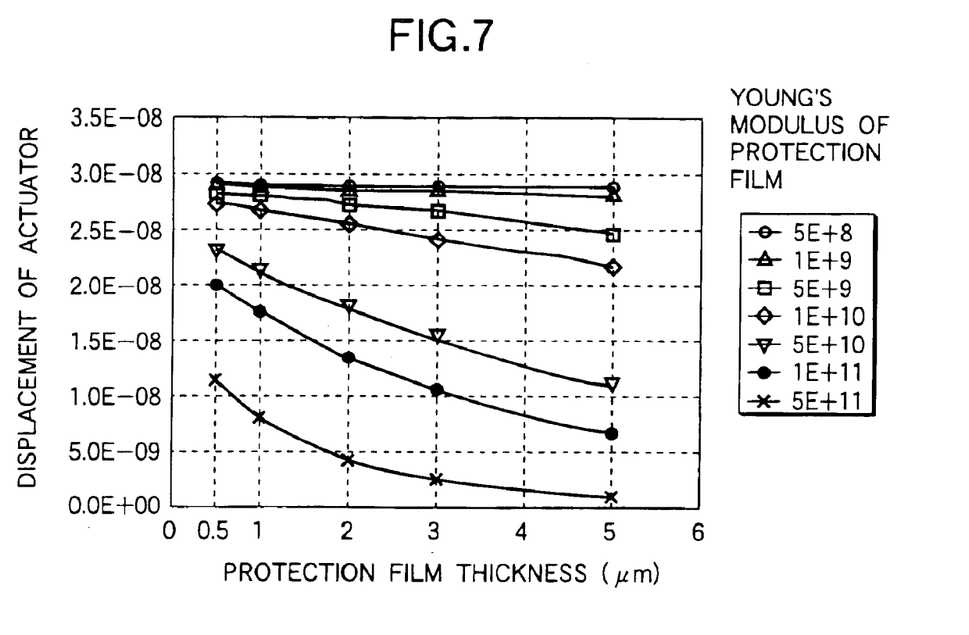
FIG. 7 is a graph showing variations of displacement quantities of the actuator with respect to a protection film thickness, with a parameter of Young's modulus of the protection film.
Figure 8:
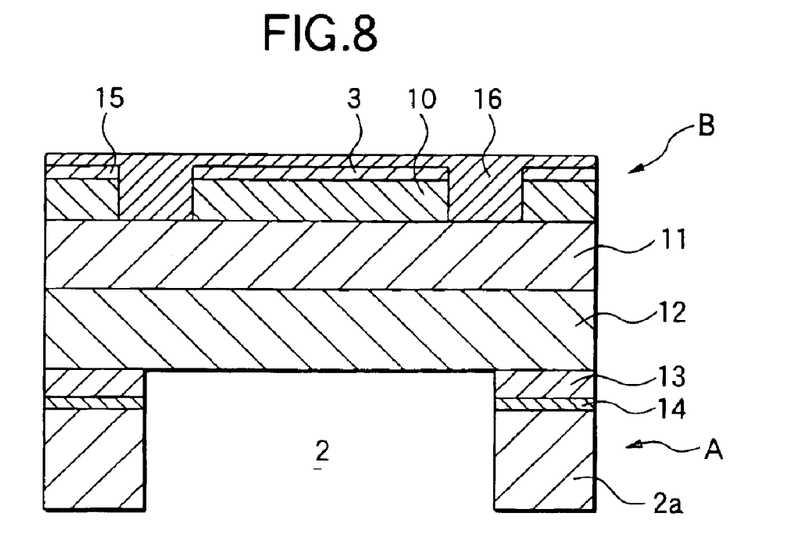
FIG. 8 is a cross sectional view showing still another structure of the actuator part of the ink jet head.

FIG. 1 is a perspective view showing an overall arrangement of an ink jet recording device using ferroelectric elements, each of which is an embodiment of the present invention. FIG. 2 is a cross sectional view showing an overall arrangement of an ink jet recording head of the FIG. 1 device. FIG. 3 is a perspective view showing a key portion of the ink jet recording head shown in FIG. 2. FIG. 4 is a plan view showing a key portion of an actuator part in the FIG. 2 ink jet head. FIGS. 5 and 6 are cross sectional views showing exemplar structures of the in the actuator part FIG. 2 ink jet head. FIG. 7 is a graph showing variations of displacement quantities of the actuator with respect to a protection film thickness when the ferroelectric element as the embodiment of the invention is used as the actuator. In the graph, the Young's modulus of the protection film is used as a parameter FIG. 8 is a cross sectional view showing still another structure of the actuator part in the FIG. 2 ink jet head.

Reference is made to FIG. 1, an ink jet recording device 40 is provided with an ink jet head 41, constructed according to the present invention, which records something on a recording medium by utilizing piezoelectric effect of a ferroelectric element. To record something on a recording medium 42, such as a recording sheet of paper. the ink jet head 41 ejects an ink drop, and the ink drop lands on the recording medium 42. The ink jet head 41 is mounted on a carriage 44, which is mounted on a carriage shaft 43 disposed in the main scan direction X. The ink jet head 41 is reciprocatively moved in the main scan direction X with the reciprocative movement of the carriage 44 along the carriage shaft 43. The ink jet recording head 40 includes movement means 45 which may consist of a plurality of rollers. The movement means 45 moves the recording medium 42 in the sub-scan direction Y substantially vertical to the width direction (i e., main scan direction X) of the ink jet head 41.

FIG. 2 is a cross sectional view showing an overall arrangement of the ink jet recording head 41, which is constructed according to the invention. FIG. 3 is a perspective view showing a key portion of the ink jet recording device shown in FIG. 2.

In FIGS. 2 and 3, reference character "A" designates a pressure generating part having an opening 1 formed therein; "B" designates an actuator part disposed covering the upper opened surface of the recess 1; and "C" designates an ink passage part disposed covering the lower opened surface of the opening 1. The opening 1 of the pressure generating part A is defined by the actuator part B and the ink liquid passage part C, which are located above and below the opening, thereby forming a pressure generating chamber 2. Individual electrodes or second electrodes 3 are provided on the actuator part B at positions above the pressure generating chamber 2. As seen from FIG. 2, a number of pressure generating chambers 2 and a number of individual electrodes 3 are disposed in zig-zag fashion. The ink liquid passage part C includes common liquid chambers S each used in common for the pressure generating chambers 2 arranged in the ink liquid supplying direction, ink supply ports 6 for communicatively connecting the common liquid chambers 5 to the pressure generating chambers 2, and ink passages 7 through which ink liquid flows out of the pressure generating chambers 2. Reference character D is a nozzle plate having nozzle orifices 8 formed therein, which are communicatively connected to ink passages 7. In FIG. 2, reference character E is an IC chip E which applies voltage to the number of individual electrodes 3 by way of bonding wires BW.

A structure of the actuator part B will be described hereunder with reference to FIG. 4.

FIG. 4 is a plan view showing a part of the actuator part in the FIG. 2 ink jet head. A cross section of the actuator part B illustrated in FIG. 5 is viewed in a direction perpendicular to the ink liquid supplying direction shown in FIG. 2, and is taken on line E–E' in FIG. 4. The pressure generating part A illustrated includes pressure generating chambers 2 arrayed in the direction perpendicular to the ink liquid supplying direction.

The actuator part B is formed with individual electrodes 3 located above the pressure generating chambers 2, ferroelectric film 10 located right under the individual electrodes 3, a common electrode or first electrode 11, and a vibration plate 12 which are displaced to vibrate by ferroelectric effect of the ferroelectric film 10. The vibration plate 12 is made of a conductive material. The actuator part B includes vertical walls 13 respectively located on partitioning walls 2a for partitioning the pressure generating chambers 2. In the figure, reference numeral 14 designates adhesive 14 for bonding the pressure generating part A to the actuator part B. The vertical walls 13 have each the following function. When the pressure generating part A and the actuator part B are bonded by using the adhesive 14, part of the adhesive 14 highly possibly flows out of the partitioning walls 2a. In this case, the vertical walls 13 increases a distance between the upper surface of the pressure generating chambers 2 and the lower surface of the vibration plate 11 so that the adhesive 14 does not attach to the vibration plate 12 and the vibration plate 12 displaces and vibrates as intended. The vibration plate 12 may be formed integrally with the common electrode 11.

In the embodiment, the individual electrodes 3 are made of Pt (platinum); the ferroelectric film 10 is made of lead titanate zirconate (PZT); the common electrode 11 is made of Cu (copper); and the vibration plate 12 is made of Cr (chromium). Those materials are typical examples, and other suitable materials may be used, as a matter of course. Also in the embodiment, a thickness of the individual electrode 3 is within 0.1 to 0.5 μm; a thickness of the ferroelectric film 10 is within 3 to 5 μm; and a thickness of the common electrode 11 is within 0.1 to 6 μm.

While in the embodiment, the vibration plate is made of Cr (chromium) as a conductive material, the vibration plate may be formed with an oxide film, viz., it may be made of a nonconductive material. In the embodiment, the common electrode and the vibration plate are separately provided. If necessary, one and the same film may be used for both the common electrode and the vibration plate.

The individual electrodes 3, ferroelectric films 10, common electrode 11 and vibration plate 12 may be formed by any of known film forming methods, such as a thick film method, e.g., screen printing, a coating method, e.g., dipping, sputtering method, CVD method, vacuum deposition method, and plating method.

As shown in FIGS. 4 and 5, lead wires 15 for feeding electric power to the individual electrodes 3 are formed on the same plane as of the individual electrodes 3. A protection film of, for example, 16 of 0.5 to 5 μm thick is formed entirely covering the exposed parts of the ferroelectric film 10 and the individual electrodes 3, and covering the lead wires 15. A thickness of the protection film is determined depending on a thickness of the ferroelectric film 10 and a Young's modulus of a protection film used. In the instant embodiment, a Young's modulus of the protection film is selected to be within a range of approximately 5.0E+08 to 5.9E+09 (N/cm2) in the light of lessening the displacement restriction on the ferroelectric film displacement. If the thickness of the protection film is 0.5 μm or shorter, it cannot completely shut off the influence by external environment conditions, e.g., humidity. If the protection film thickness is in excess of 5 μm, it is thicker than the ferroelectric film 10 and the individual electrodes 3. In this circumstance, it is impossible to obtain desired element characteristics. In the embodiment, the protection film entirely covers the lead wires 15. If required, the protection film may be configured so as to cover only the raised parts of the lead wires.

The individual electrodes 3, ferroelectric films 10, common electrode 11, lead wires 15 and protection film 16 cooperate to make up ferroelectric elements. The thicknesses of them are as mentioned above. Accordingly, a thickness of the ferroelectric element is approximately 10 μm as a whole, and is extremely thin.

The protection film entirely covers the exposed parts of the ferroelectric film 10 and the individual electrodes 3, and covers the lead wires 15. Therefore, the ferroelectric element is completely covered with the protection film. As a result, the ferroelectric element is completely shut off from environmental conditions.

Therefore, even if the ferroelectric element has defects at some locations, there is no chance that the element is affected by environmental conditions, e.g., humidity, deterioration of the ferroelectric element progressively grows through the defects, resulting in dielectric breakdown of the element.

When an ink jet head is constructed using actuators using such ferroelectric elements, the element protection is ensured in the head assembling process, and the ferroelectric elements will not be damaged by flaws or disconnection caused during the assembling stage.

The protection film 16 is preferably made of a material whose Young's modulus is smaller than that of the ferroelectric film 10, exactly ½₀ or smaller of (1.0E+11 (N/m2)), which is the Young's modulus of the ferroelectric film 10.

A relationship between the thickness of the protection film 16 and the displacement quantity of the actuator is shown in FIG. 7. As seen from the graph, where the Young's modulus of the protection film 16 is ¹⁄₁₀ or larger of the Young's modulus of the ferroelectric film 10, the displacement quantity of the actuator rapidly decreases with increase of the thickness of the protection film 16. Accordingly, to secure a freedom of thickness selection of the protection film 16, it is preferable that the protection film 16 is made of a material whose Young's modulus is ¹⁄₂₀ as large as that of the ferroelectric film 10.

Thus, it is preferable to make the protection film 16 of a material whose Young's modulus is smaller than that of the ferroelectric film 10, exactly ¹⁄₂₀ or smaller of the Young's modulus of the ferroelectric film 10. If such a material is used, the protection film 16 will displace following a displacement of the ferroelectric film 10. Accordingly, the restriction on the displacement of the ferroelectric film 10 by the protection film 16 is lessened.

Examples of materials whose Young's moduli are polyimide (Young's modulus: 8.0E+09 (N/m2)), nylon (Young's modulus: 3.6E+09 (N/m2)), polyethylene (Young's modulus: 7.6E+08 (N/m2)), natural rubber (Young's modulus:

1.0E+06 (N/m2)), and silicone (Young's modulus: 2.1E+08 (N/m2)). Examples of rubber materials are acrylic, urethane and vinyl chloride-based materials.

The protection film 16 maybe made of any of those materials or a combination of two or more number of those materials. Various materials other than the materials enumerated above may be used for making the protection film 16, if those materials have Young's moduli smaller than the Young's modulus of the ferroelectric film 10.

Various methods may be used for forming the protection film 16 may be formed by various methods, such as dipping method, brushing method, spin coating method, and spraying method.

As shown in FIG. 5, the protection film 16 is indented at parts P of the ferroelectric element at which the individual electrodes 3 and the lead wires 15 are not present. By so shaping the protection film, the indented parts of the protection film 16 as the parts P located at both ends of the ferroelectric film 10 are easy to bend. This feature further lessens the restriction on the displacement of the ferroelectric film 10 by the protection film 16. As shown in FIG. 6, the recesses at the parts P not having the individual electrodes 3 and the lead wires 15 may be R shaped as indicated by reference numeral 17. Where the bottom of each indented part is R shaped to be smooth, concentration of stress to the corners of the indented part bottom is lessened. This will prevent the protection film from being cracked.

In the embodiment, the protection film 16 is indented at parts P of the ferroelectric element at which the individual electrodes 3 and the lead wires 15 are not present. If the situation demands, those parts may be in level with the parts having the individual electrodes 3 and the lead wires 15, as shown in FIG. 8. In the case where the parts P not having the individual electrodes 3 and the lead wires 15 are stepwise indented as shown in FIGS. 5 and 6, the protection film is likely to be thinned at the end faces of both ends of the ferroelectric film 10. If the protection film is so thinned, ambient factors, e.g., humidity, easily affect the ferroelectric element through the thinned parts of the ferroelectric film 10. If those pats are not recessed, but positioned in level with the parts having the individual electrodes 3 and the lead wires 15, the end face problem of the ferroelectric film 10 does no arise, and the ferroelectric element is completely shut off from the environmental conditions.

While in the embodiment described above, the ferroelectric element constructed according to the invention is applied to the actuator for the ink ejection in the ink jet recording device, it is evident that the ferroelectric element may be applied to other devices than the above, such as ferroelectric element basis sensors, e.g., piezoelectric gyro, and temperature sensors based on the pyroelectric property of a ferroelectric material.

In the embodiment, the individual electrodes are used as second electrodes and the common electrode is used as a second electrode. If required, the individual electrodes may be used as the first electrode and the common electrode may be used as the second electrode.

It is preferably that the insulation reinforcing film explained in the first embodiment is used as the protection film in the second embodiment.

If the actuator using the ferroelectric elements as described above is used, a stable displacement of the vibration plate is ensured. Accordingly, the ink jet head using such an actuator can stably eject ink drops. And, the ink jet recording device with such an ink jet head can print high quality pictures since the ink ejection is stable.

As seen from the foregoing description, the ferroelectric element is completely covered with the protection film. Accordingly, it is completely shut off from ambient conditions. If the protection film is preferably made of a material whose Young's modulus is smaller than that of the ferroelectric film, exactly $\frac{1}{20}$ or smaller of the Young's modulus of the ferroelectric film, the protection film will displace following a displacement of the ferroelectric film. Accordingly, the restriction on a displacement of the ferroelectric film by the protection film is lessened.

If the protection film is indented at parts of the ferroelectric element at which the individual electrodes and the lead wires are not present, the indented parts of the protection film as the parts located at both ends of the ferroelectric film are easy to bend. This feature further lessens the restriction on the displacement of the ferroelectric film by the protection film.

If the actuator using such ferroelectric elements is used, a stable displacement of the vibration plate is ensured. Accordingly, the ink jet head using such an actuator can stably eject ink drops.

And, the ink jet recording device with such an ink jet head can print high quality pictures since the ink ejection is stable.

What is claimed is:

1. A ferroelectric element comprising:
   a first electrode;
   a ferroelectric film formed on said first electrode;
   a second electrode formed on said ferroelectric film;
   a lead wire, formed on the same plane as of said second electrode, for feeding electric power to said second electrode; and
   a protection film entirely covering exposed parts of said ferroelectric film and said second electrode, and covering at leas a part of said lead wire;
   wherein said protection film is made of a material whose Young's modulus is smaller than that of said ferroelectric film,
   wherein said protection film is made of a material whose Young's modulus is $\frac{1}{20}$ or smaller than the Young's modulus of said ferroelectric film.

2. A ferroelectric element according to claim 3, wherein said ferroelectric film being formed with an insulation reinforcing film containing at least one of the elements constituting said ferroelectric film.

3. A ferroelectric element according to claim 1 or 2, wherein said protection film is indented at parts of said ferroelectric element at which said second electrode and said lead wire are not present.

4. An actuator using a ferroelectric element as defined in claim 3.

5. An ink jet head comprising: an actuator as defined in claim 4, and a plurality of pressure generating chambers each containing ink liquid, and a displacement of said actuator acting on said pressure generating chambers.

6. An ink jet recording device having the ink jet head defined in claim 5.

7. An actuator using a ferroelectric element as defined in claim 1 or 2.

8. A ferroelectric element comprising:
   a first electrode;
   a ferroelectric functional film formed on said first electrode;
   a second electrode formed on said ferroelectric functional film; and
   said ferroelectric functional film being formed with a ferroelectric film and an insulation reinforcing film, said insulation reinforcing film containing at least one of the elements constituting said ferroelectric film,
   wherein an mount of oxygen contained in said insulation reinforcing film is larger than that of oxygen in said ferroelectric film.

9. A ferroelectric element according to claim 8, wherein said ferroelectric film and said insulation reinforcing film are each made of a perovskite oxide, corundum type oxide, or bismuth layered oxide, or mixture of them which is expressed by the following chemical formula AxByOz where A contains at least one kind of element from among Pb, Ba, La, Li, Sr, Bi, Na, and K; and B contains at least one kind of element elected from among Ti, Ta, Mg, Mo, Ni, and Nb.

10. A ferroelectric element according to claim 8, wherein said ferroelectric film is made of a perovskite oxide containing at least one kind of element selected from among Pb, La, Zr and T.

11. A ferroelectric element according to claim 9 or 10, wherein an amount of oxygen contained in said insulation reinforcing film is larger than that of oxygen in said ferroelectric film.

12. A ferroelectric element according to claim 9 or 10, wherein a crystallinity of said insulation reinforcing film is lower than that of said ferroelectric film.

13. A ferroelectric element according to claim 9 or 10, wherein an amount of Pb contained in said insulation reinforcing film is larger than that of Pb in said ferroelectric film.

14. A ferroelectric element according to claim 9 or 10, wherein a relative dielectric constant of said insulation reinforcing film is lower than that of said ferroelectric film.

15. A ferroelectric element comprising:
a first electrode;
a ferroelectric functional film formed on said first electrode;
a second electrode formed on said ferroelectric functional film; and
said ferroelectric functional film being formed with a ferroelectric film and an insulation reinforcing film, said insulation reinforcing film containing at least one of the elements constituting said ferroelectric film,
wherein a crystallinity of said insulation reinforcing film is lower than that of said ferroelectric film.

16. A ferroelectric element comprising:
a first electrode;
a ferroelectric functional film formed on said first electrode;
a second electrode formed on said ferroelectric functional film; and
said ferroelectric functional film being formed with a ferroelectric film and an insulation reinforcing film, said insulation reinforcing film containing at least one of the elements constituting said ferroelectric film,
wherein an amount of Pb contained in said insulation reinforcing film is larger than that of Pb in said ferroelectric film.

17. A ferroelectric element comprising:
a first electrode;
a ferroelectric functional film formed on said first electrode;
a second electrode formed on said ferroelectric functional film; and
said ferroelectric functional film being formed with a ferroelectric film and an insulation reinforcing film, said insulation reinforcing film containing at least one of the elements constituting said ferroelectric film,
wherein said ferroelectric film is made of a perovskite oxide containing at least one kind of element selected from among Pb, La, Zr and T,
wherein said insulation reinforcing film is a polycrystalline film containing either of pyrochlore-type oxide or pyrochlore-type oxide or an amorphous film.

18. An actuator using an ferroelectric element as defined in any of claims 14 to 17.

19. An ink jet head comprises an actuator define in claim 18, and a plurality of pressure generating character each containing ink liquid on which a displacement of said actuator acts.

20. An ink jet recording device includes an ink jet head defined in claim 19.

21. A ferroelectric element comprising:
a first electrode;
a ferroelectric functional film formed on said first electrode;
a second electrode formed on said ferroelectric functional film; and
said ferroelectric functional film being formed with a ferroelectric film and an insulation reinforcing film, said insulation reinforcing film containing at least one of the elements constituting said ferroelectric film,
wherein a relative dielectric constant of said insulation reinforcing film is lower than that of said ferroelectric film.

22. A ferroelectric element comprising:
a first electrode;
a ferroelectric film formed on said first electrode;
a second electrode formed on said ferroelectric film; and
a protection film entirely covering an exposed part of said second electrode;
wherein said protective film is made of a material whose Young's modulus is smaller than that of said ferroelectric film,
wherein said protection film is made of a material whose Young's modulus is 1/20 or smaller than the Young's modulus of said ferroelectric film.

23. A ferroelectric element according to claim 22, wherein said ferroelectric film being formed with an insulation reinforcing film containing at least one of the elements constituting said ferroelectric film.

24. An actuator using a ferroelectric element as defined in claims 22 to 23.

25. An ink jet head comprising: an actuator as defined in claim 24, and a plurality of pressure generating chambers each containing ink liquid, and a displacement of said actuator acting on said pressure generating chambers.

26. An ink jet recording device having the ink jet head defined in claim 25.

* * * * *

UNITED STATES PATENT AND TRADEMARK OFFICE
CERTIFICATE OF CORRECTION

PATENT NO. : 7,023,036 B2
APPLICATION NO. : 10/261984
DATED : April 4, 2006
INVENTOR(S) : Watanabe et al.

It is certified that error appears in the above-identified patent and that said Letters Patent is hereby corrected as shown below:

Column 5

Line 59, please delete "Across-section" and insert therefor - - A cross section - -.

Column 7

Line 32, please delete "parovskite-type" and insert therefor - - perovskite-type - -.

Column 8

Line 17, please delete "increased The" and insert therefor - - increased. The - -.

Column 12

Line 67, please delete "chambers S" and insert therefor - - chambers 5 - -.

Column 16

Claim 1, line 30, please delete "leas" and insert therefor - - least - -.

Column 18

Claim 19, line 15, please delete "define: and insert therefor - - defined - -.

Claim 19, line 16, please delete "character" and insert therefor - - chambers - -.

UNITED STATES PATENT AND TRADEMARK OFFICE
CERTIFICATE OF CORRECTION

PATENT NO. : 7,023,036 B2
APPLICATION NO. : 10/261984
DATED : April 4, 2006
INVENTOR(S) : Watanabe et al.

It is certified that error appears in the above-identified patent and that said Letters Patent is hereby corrected as shown below:

Column 18

Claim 24, line 53, please delete "to" and insert therefor - - or - -.

Signed and Sealed this

Twenty-eighth Day of November, 2006

JON W. DUDAS
*Director of the United States Patent and Trademark Office*